United States Patent
Nishi

(10) Patent No.: US 8,421,656 B2
(45) Date of Patent: Apr. 16, 2013

(54) TIME-INTERLEAVED ANALOG-TO-DIGITAL CONVERSION CIRCUIT HAVING POLYPHASE CORRECTION FILTER

(75) Inventor: Kazuto Nishi, Chiba (JP)

(73) Assignee: Kawasaki Microelectronics Inc, Chiba (JP)

( * ) Notice: Subject to any disclaimer, the term of this patent is extended or adjusted under 35 U.S.C. 154(b) by 71 days.

(21) Appl. No.: 13/071,915

(22) Filed: Mar. 25, 2011

(65) Prior Publication Data
US 2011/0234439 A1    Sep. 29, 2011

(30) Foreign Application Priority Data

Mar. 25, 2010 (JP) .................................. 2010-069320

(51) Int. Cl.
*H03M 1/06* (2006.01)

(52) U.S. Cl.
USPC ........... 341/118; 375/349; 375/355; 375/233; 375/350; 382/275; 370/418; 370/507; 370/545; 348/375; 348/373

(58) Field of Classification Search .......... 341/118–155; 375/230–355; 382/275; 370/418, 507, 545; 348/370–375
See application file for complete search history.

(56) References Cited

U.S. PATENT DOCUMENTS

| | | | |
|---|---|---|---|
| 5,748,335 A * | 5/1998 | Honma et al. ................ 358/445 |
| 6,545,626 B1 | 4/2003 | Nakada | |
| 6,836,235 B2 | 12/2004 | Asami | |
| 7,466,250 B2 * | 12/2008 | Buisson ........................ 341/120 |
| 7,492,848 B2 * | 2/2009 | Gurrapu ........................ 375/355 |
| 7,693,214 B2 * | 4/2010 | Shida ............................. 375/232 |
| 2003/0058144 A1 | 3/2003 | Nakada | |
| 2004/0032358 A1 | 2/2004 | Asami | |

OTHER PUBLICATIONS

Johansson, H. et al., "Reconstruction of Two-Periodic Nonuniformly Sampled Signals Using Polynomial Impulse Response Time-Varying FIR Filters," *IEEE International Symposium on Circuits and Systems*, Sep. 2006, pp. 2993-2996.

Jamal, S. et al., "A 10-b 120-Msample/s Time-Interleaved Analog-to-Digital Converter With Digital Background Calibration," *IEEE Journal of Solid-State Circuits*, Dec. 2002, pp. 1618-1627, vol. 37, No. 12.

* cited by examiner

*Primary Examiner* — Lam T Mai
(74) *Attorney, Agent, or Firm* — Oliff & Berridge, PLC

(57) ABSTRACT

Time-interleaved analog-to-digital (AD) conversion circuit, which includes first and second AD converters that generate first and second digital signal sequences by converting an analog input signal into first and second digital signals with a first frequency at first and second timings mutually different with each other is disclosed. The AD conversion circuit further includes a FIFO that receives the first and second digital signal sequences, and a correction filter including first and second portions that are supplied with a common clock signal. The correction filter generates a first corrected digital signal sequence by adding the first synchronized digital signal sequence and the second synchronized digital signal sequence passed through the first portion of the correction filter, and a second corrected digital signal sequence by passing the second synchronized digital signal sequence through the second portion of the correction filter.

10 Claims, 6 Drawing Sheets

○ : Df = 0
◇ : Df = 0.5Ts'

Impulse response = timing error × fixed coefficient

TIME-INTERLEAVED ANALOG-TO-DIGITAL CONVERSION CIRCUIT HAVING POLYPHASE CORRECTION FILTER

This application claims priority from Japanese Patent Application No. 2010-069320, filed on Apr. 25, 2010, which is hereby incorporated by reference in its entirety.

BACKGROUND

This disclosure relates to analog to digital conversion circuits that interleave a plurality of analog-to-digital (AD) converters to improve total sampling rates and include filters to correct errors in sampling timings of the AD converters.

<First Conventional Art>

Time-interleaved AD conversion systems having improved total sampling rates by interleaving a plurality of AD converters, which sample an analog signal at different timings, are known. It is further proposed to correct errors in the interleaving operation by providing correction filters corresponding to respective AD converters in, for example, US patent publication No. US 2004/032358 (Patent document 1). The correction filter has a function of recovering a value that is supposed to be sampled, and stores coefficient corresponding to timing errors to be corrected.

<Second Conventional Art>

In addition, for example, US patent publication No. US 2003/058144 (Patent document 2) proposes to provide a finite impulse response (FIR) type correction filter having two input terminals and output terminals. The FIR filter outputs an output of one of the AD converters after a delay from one of the output terminals. The FIR filter further outputs, from the other one of the output terminals, a signal generated by processing the output signals of the AD converters input to both of the input terminals. Finally a multiplexer interleaves, or alternately outputs, two output signals of the FIR filter.

The correction filter of the first conventionally art, which has a function to recover a value that is supposed to be sampled, may be constructed as show in FIG. 8. This is so-called Fractional Delay Filter, which has impulse responses shown in FIG. 1 when the number of taps $N_T$ (or the number of multipliers) is 7.

When the number of AD converters is 2, outputs of AD converters are interleaved after processing an output of one of the converters by a correction filter of the characteristic show in FIG. 1 and delaying an output of the other one of the converters by a delay circuit for a timing adjustment. The filter characteristic of the correction filter is set to the characteristic of $\Delta t=0$ if there is no error $\Delta t$ in the sampling timings of two AD converters. When there is an error, the filter characteristic is set to the characteristic of, for example, $\Delta t=0.5$ $T_S'$. $T_S'$ is equal to $0.5\ T_S$, and $T_S$ represents the sampling period of each AD converter.

In the first conventional art, it is necessary to supply clock signals with successively different phases to the plurality of AD converters to control timings that respective converters sample the analogue signal. It is also necessary to supply clock signals with successively different phases to the correction filters corresponding to respective AD converters. Thus, because it is necessary to supply multiphase clock signals to both the AD converters and correction filters, the timing design of the semiconductor integrated circuit that equipped with these blocks becomes complex.

Moreover, as explained above, the correction filter has a construction that stores coefficients corresponding to error values to be corrected in a storage block beforehand. However, in actual AD conversion circuits, the error value is different for each product due to variation in the delay time of buffers in the clock supply route and varies with, for example, the power supply voltage and temperature. Therefore, in order to store a large number of coefficients corresponding to a variety of error values, a large memory block is required. Alternatively, it would be possible to measure an actual error value and generate a coefficient corresponding to the measured error value by using an arithmetic circuit. In this case, however, it is necessary to integrate a complicated arithmetic circuit in a semiconductor integrated circuit.

The second conventional art also has a problem that it is necessary to supply multi-phase clock signal to the correction filter, and the timing design becomes complex. There is an additional problem that storing a large number of coefficients corresponding to various error values or providing an arithmetic circuit to generate the coefficients is required.

It would be advantageous to provide time-interleaved AD conversion circuits that are capable to conduct timing designs easily. It would be further advantageous to provide time-interleaved AD converters having correction filters that can correct various values of sampling timing errors without requiring large memory blocks or complicated arithmetic circuits.

SUMMARY

Various exemplary embodiments according to this disclosure provide time-interleaved analog-to-digital (AD) conversion circuits including first and second AD converters, a FIFO, a correction filter, and a multiplexer. The first and second AD converters generate first and second digital signal sequences by converting an analog input signal into first and second digital signals with a first frequency at first and second timings mutually different with each other. The FIFO receives the first and second digital signal sequences and outputs the first and second digital signal sequences at same timings as first and second synchronized digital signal sequence. The correction filter corrects errors in the second digital signal sequences caused by an error in the second timings from reference timings The correction filter includes first and second portions that are supplied with a common clock signal having the first frequency and operate in synchronous with the common clock signal Each of the first and second portions of the correction filter includes a plurality of delay elements each having a delay time equal to a cycle period of the common clock signal. The correction filter generates a first corrected digital signal sequence by passing the second synchronized digital signal sequence through the first portion of the correction filter and adding the first synchronized digital signal sequence and the second synchronized digital sequence passed through the first portion of the correction filter. The correction filter further generates second corrected digital signal sequence by passing the second synchronized digital signal sequence through the second portion of the correction filter.

According to various exemplary embodiments, the time-interleaved AD conversion circuits may include a decimation filter. The decimation filter may include first portion and second portion that are supplied with the common clock signal and operate in synchronous with the common clock signal. Each of the first and second portions of the decimation filter includes a second delay element having a second delay time equal to the cycle period of the common clock signal. The decimation filter may generates an output digital signal sequence by passing the first corrected digital sequence through the first portion of the decimation filter and the second corrected digital sequence through the second portion of the decimation filter, and adding the first corrected digital signal sequence passed through the first portion of the decimation filter and the second corrected digital signal sequence passed through the second portion of the decimation filter.

According to various exemplary embodiments, each of the first and second portions of the correction filter may be a Farrow type filter. The Farrow type filter includes $N_{SUB}$ ($N_{SUB} \geq 2$) FIR type sub-filters with fixed coefficients each receiving the second synchronized digital signal sequence and including a corresponding plurality of the delay elements. Each of the Farrow type filter includes a first multiplier that multiplies an output of a first one of the sub-filters by a normalized value of the error in the second timings, second to ($N_{SUB}-1$)th multipliers each multiplying a sum of an output of corresponding one of the sub-filters and an output of a preceding one of the multipliers by the normalized value of the error, and an output terminal that outputs a sum of an output of the ($N_{SUB}-1$)th multiplier and an output of an $N_{SUB}$-th one of the sub-filters as an output of the Farrow type filter.

According to various exemplary embodiments, the time-interleaving AD conversion circuits may include an error measurement circuit that measures the error in the second timings and generates the normalized value of the error.

According to various exemplary embodiments, the fixed coefficients of the FIR type sub-filters of the first and second portions of the correction filter are determined by:
(1) under an assumption that, for each of a first to an Ner-th (Ner$\geq$2) one of the normalized value of the error in the second timings:

(a) an impulse response of each of Ner $N_T$-tap ($N_T \geq 2$) FIR type filters that is suitable to correct the normalized value of the error; and (b) an impulse response of an imaginary Farrow type filter which includes $N_{SUB}$ $N_T$-tap FIR type sub-filters, a first multiplier that multiplies an output of a first one of the sub-filters by the normalized value of the error, a second to a ($N_{SUB}-1$)th multipliers each multiplying a sum of an output of preceding one of the multipliers and an output of corresponding one of the sub-filters by the normalized value of the error, and an output terminal that outputs a sum of an output of the ($N_{SUB}-1$)th multiplier and an output of an $N_{SUB}$-th one of the sub-filters as an output of the Farrow type filter;

are identical with each other, calculating coefficients of each of the sub-filters of the imaginary Farrow type filter; and
(2) separating even-numbered ones and odd-numbered ones of the calculated coefficients of each of the sub-filters of the imaginary Farrow type filter as the fixed coefficients of each of the sub-filters of the first and second portions of the correction filters, respectively.

BRIEF DESCRIPTION OF DRAWINGS

Various exemplary embodiments numerically controlled oscillators and oscillation methods for generating function values will be describe in detail with reference to the following figures, wherein.

DETAILED DESCRIPTION OF EMBODIMENTS

In various exemplary embodiments of this disclosure, FIFOs provided between AD converters and correction filters perform clock-transfer between a clock of the AD converters and a clock of the digital block arranged after the FIFO. That is, the FIFO synchronizes a pair of digital data that are generated at mutually different timings. In addition, the correction filter has a polyphase structure. As a result, timing design of the digital block becomes easy.

Figure 4:
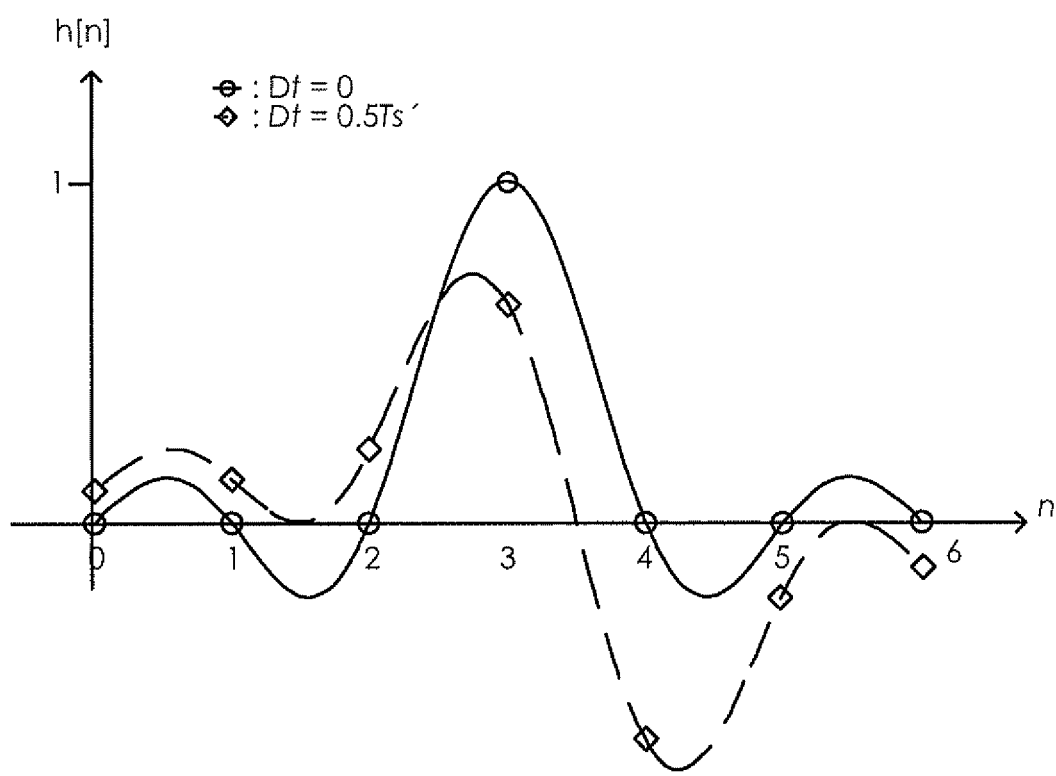
FIG. 4 illustrates exemplary impulse responses of correction filter used in first exemplary AD conversion circuit according to this disclosure.

Moreover, the correction filter utilizes impulse responses of expression (1), which are shown in FIG. 4. As a result, the filter can perform correction even if an input analog signal has a bandwidth of up to the sampling frequency fs of the AD converters. That is, the input analog signal may have a bandwidth of up to a half of 2 fs, which is a reciprocal value of the sampling period $T_S/2$ realized by interleaving two AD converters.

$$h[n] = \mathrm{sinc}\left\{\frac{\pi}{2}\left(n - \frac{N_T-1}{2} - \frac{\Delta t}{Ts'}\right)\right\}\cos\left\{\frac{\pi}{2}\left(n - \frac{N_T-1}{2} + \frac{\Delta t}{Ts'}\right)\right\} \quad (1)$$

Here, $T_S'$ represents a sampling period of the AD converters, which is a half of a sampling period $T_S$ of each of the AD converters. $N_T$ represents a number of taps of the filter, and n represents indexes of the impulses.

First Exemplary Embodiment

Figure 6:
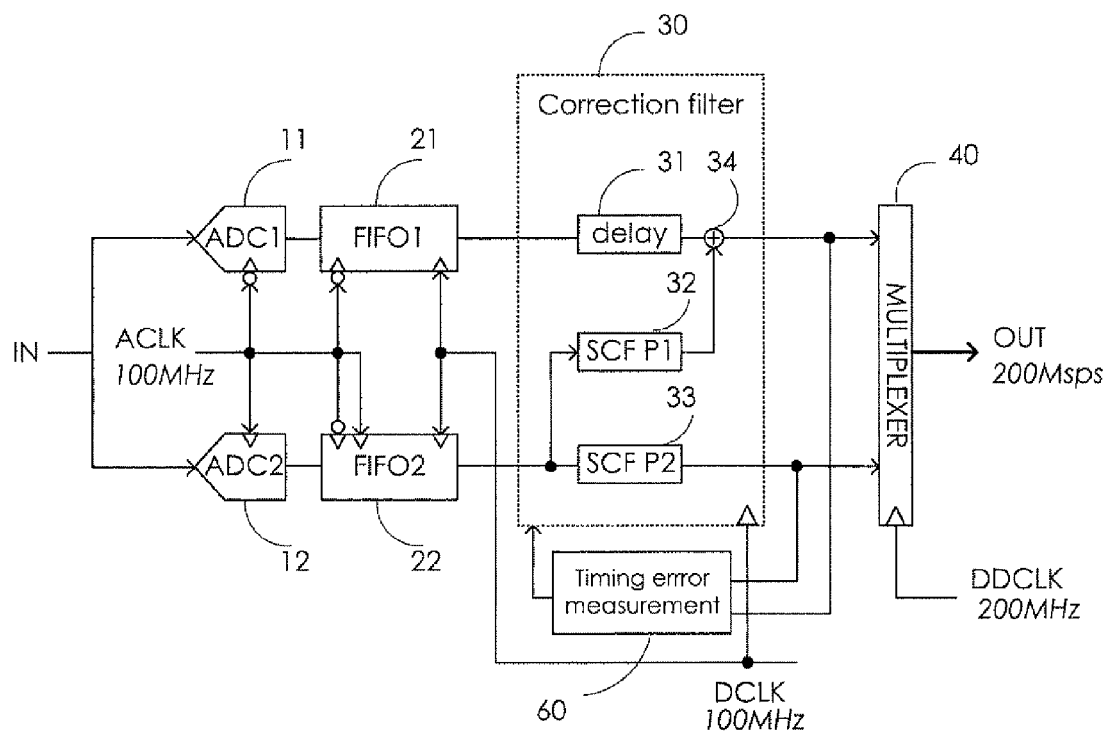
FIG. 6 is a block diagram showing construction of first exemplary AD conversion circuit according to this disclosure.

FIG. 6 shows a first exemplary AD conversion circuit according to this disclosure. Numerals 11 and 12 represent AD converters that convert input analog signal into first and second digital signals with a sampling clock ACLK having a frequency of fs (=100 MHz). In the exemplary circuit shown in FIG. 6, the sampling clock ACLK is supplied to the first AD converter 11 in the reversed phase, and the same sampling clock ACLK is supplied to the second AD converter 12 in the normal phase.

That is, the first AD converter 11 converts an input analog signal into digital signals at timings of falling edges of ACLK, and the second AD converter 12 converts the input analog signal into digital signals at timings of rising edges of ACLK. Therefore, ideally, the sampling timings of the second AD converter 12 shift from the sampling timings of the first AD converter 11 by a half of the sampling period $T_S$.

In actual, however, this ideal timing cannot be maintained because of, for example, following reasons:

(1) It is impossible to precisely keep the duty ratio of the sampling clock ACLK at 50%; and (2) It is impossible to completely match the delay times of the clock supply routs to the first and second AD converters 11 and 12.

Numerals 21 and 22 represent FIFOs of dual-clock synchronous type. The FIFOs 21 and 22 acquire first and second digital signals output from the first and second AD converters 11 and 12 at respective timings. Specifically, the same sampling clock ACLK supplied to the AD converters 11 and 12 are also supplied to the FIFOs 21 and 22 in the reversed and normal phases, respectively. The first FIFO 21 acquires the first digital signals, which are sampled by the first AD converter 11 at timings of falling edges of ACLK, at timings of falling edges of ACLK. The second FIFO 22 acquires the second digital signals, which are sampled by the second AD converter 12 at timings of rising edges of ACLK, at timings of rising edges of ACLK Another clock DCLK having the same frequency as the clock ACLK is also supplied to FIFOs 21 and 22. The FIFOs output the first and second digital signals, which are acquired at respective timings controlled by ACLK, at common timings controlled by the clock DCLK at timings of, for example, rising edges of the clock DCLK, as first and second synchronized digital signal sequences, respectively.

Figure 1:
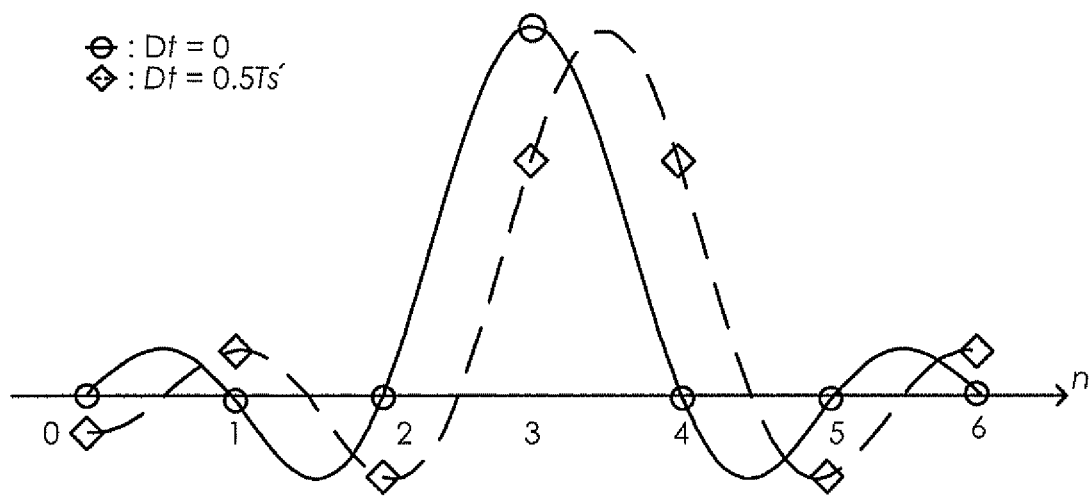
FIG. 1 illustrates exemplary impulse responses of correction filter used in patent documents 1 and 2.

Although not shown in FIG. 1 in detail, second FIFO 22 may have a construction that acquires the second digital signals at timings of rising edges of the sampling clock ACLK, re-samples at timings of falling edges of ACLK and holds within the FIFO 22, and then reads and outputs the second synchronized digital signal sequence at the same timings as the first FIFO 21 outputs the first synchronized digital signal sequence, which is controlled by the clock DCLK. As a result, a timing margin between the sampling clock ACLK and the clock DCLK increases, and the timing design becomes further easier.

Numeral 30 represents a correction filter that operates with the clock DCLK. The correction filter 30 corrects a sampling timing error Δt of the second AD converter 12, or an error from a timing of a half of $T_S$, which is the ideal operation timing of the AD converter 12, from the sampling timing of the first AD converter 11. That is, the correction filter 30 corrects the error, originated by the sampling timing error Δt, in the second synchronized digital signal sequence output from the FIFO 22.

The correction filter 30 includes a delay element 31, first and second portions of the correction filter (Skew Calibration Filters) 32 and 33, and an adder 34. The correction filter 30 is supplied with and operates based on the clock DCLK, which is commonly supplied to and controls the reading timings of the FIFOs 21 and 22. In other words, the delay element 31 and the first and second portions 32 and 33 of the correction filter that constitute the correction filter 30 are supplied with and operate based on the single phase clock DCLK, which has the same frequency as the sampling clock ACLK supplied to the AD converters 11 and 12.

Numeral 40 represents a multiplexer. The multiplexer 40 alternately outputs the first and second corrected signals, which are output from the correction filter 30, based on a clock DDCLK that is synchronized with and has a twice frequency (2 fs) of the clock DCLK.

Figure 5:
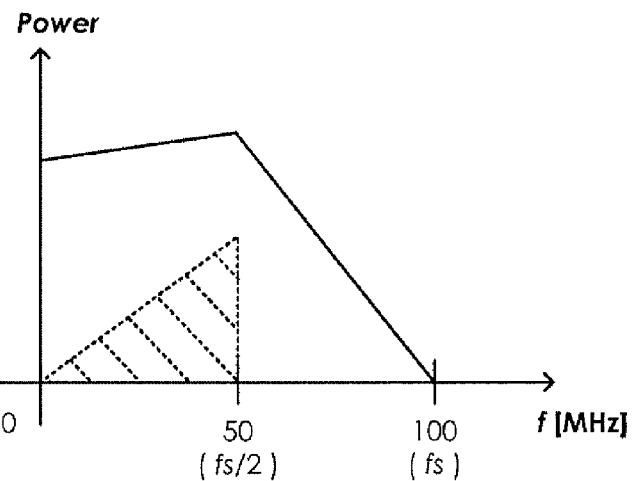
FIG. 5 illustrates exemplary frequency spectrum of digital signal generated by processing the digital signal shown in FIG. 3 by a correction filter having characteristic shown in FIG. 1.

The first and second conventional arts supply digital signals of respective AD converters, which are not synchronized with each other, to corresponding correction filters. Further, respective correction filters operate at the same timings as the corresponding AD converters as shown in FIG. 5 of the first conventional art and in FIG. 4 of the second conventional art. As a result, the timing design is difficult.

On the other hand, in the AD conversion circuit according to the first exemplary embodiment of this disclosure, the first and second digital signals output from the first and second AD converters 11 and 12 are synchronized by using the FIFOs 21 and 22, and then input to the correction filter 30. Accordingly, the correction filter 30 can be supplied with and operate based on a single phase clock. As a result, timing design is easy. Specifically, it is possible to design the delay element 31 and the first and second portions of the correction filter 32 and 33 to operate in synchronous with the same edges, e.g., rising edges, of the clock signal.

In various exemplary AD conversion circuits according to this disclosure, FIFOs transfer digital signal sequences generated by the AD converters from the analog clock ACLK that controls sampling timings of the AD converters to the digital clock DCLK that controls operation timings of the correction filter. As a result, it is possible to suppress the influence of noises generated by digital circuitry to the characteristic of analog clock ACLK.

Note that, the first and second conventional arts may also employ the clock transfer by using FIFOs. However, these conventional arts employ filters that operate at the same timings as corresponding AD converters or a succeeding stage circuit to which outputs of the filter are supplied. In order to use these structures as they are, it is necessary to supply digital signals from the AD converters to the filters while keeping the timing difference between them originated by the difference in sampling timings of the converters as it is. Therefore, different from the exemplary AD conversion circuits according to this disclosure, it is impossible to supply synchronized digital signals to the correction filters even if the clock transfer by FIFOs is employed in the first and second conventional arts.

Figure 2:
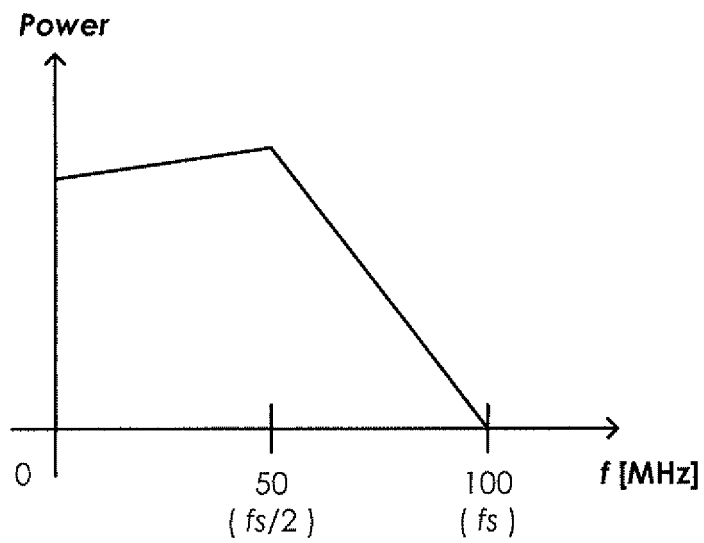
FIG. 2 illustrates exemplary frequency spectrum of input analog signal.

When the frequency of sampling clock used by two interleaved AD converter is fs=$1/T_S$, two correction filters each having characteristics shown in FIG. 1 can correct the timing error if the bandwidth of analog signal input to the AD converters is up to fs/2. Even if the analog signal to be samples has a bandwidth extending beyond the frequency of fs/2 as shown in FIG. 2, two interleaved AD converters can output a digital signal having the same spectrum as shown in FIG. 2 when the AD converters operate with no timing error.

Figure 3:
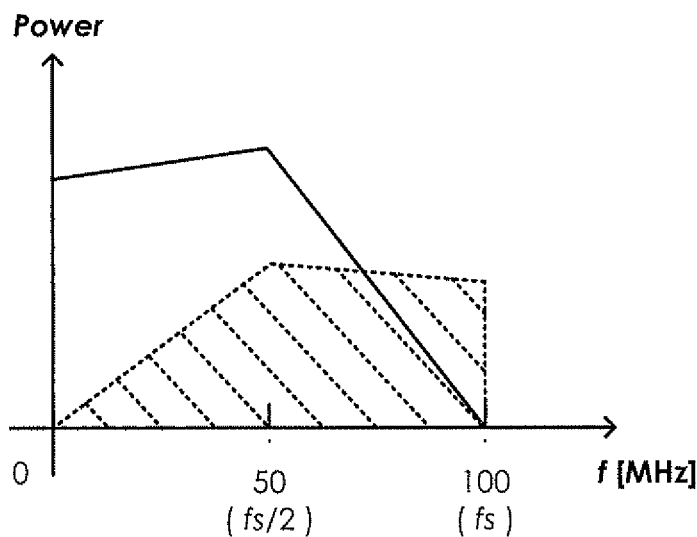
FIG. 3 illustrates exemplary frequency spectrum of digital signal with aliasing generated by time-interleave AD converters having a timing error.

However, aliasing is generated in the frequency range shown by the hatching in FIG. 3 when the sampling timings of the AD converters has an error. A spectrum component shown by the hatching in FIG. 5 remains when the digital signal having the spectrum shown in FIG. 3 is processed by a correction filter having the characteristic of FIG. 1. An analog low-pass filter may be inserted before the AD converters to remove unnecessary spectrum components. However, it is difficult to realize a filter having a steep cut-off characteristic. Therefore, in practice, it is necessary to make the bandwidth of input analog signal narrower than fs/2 in order to avoid the aliasing.

Various exemplary embodiments of this disclosure utilize correction filters having characteristics, or impulse responses, shown in FIG. 4 and expression (1). As a result, aliasing components can be removed even if digital signals generated by sampling an analog signal having a bandwidth extending to fs, as shown in FIG. 2, with time-interleaved AD converters having a timing error is processed. The correction by using the filter having the characteristics shown in FIG. 4 is described in Shafiq M. Jamal, IEEE Journal of Solid-State Circuits, Vol. 37, No. 12, 2006 (non-patent documents 1), which hereby incorporated by reference in its entirety.

The first portion of the correction filter 32 has impulse responses of even-numbered indexes shown in FIG. 4, and the second portion of the correction filter 33 has impulse responses of odd-numbered indexes shown in FIG. 4. That is, impulse responses of the filter are separated in two groups and the filter has a polyphase structure. As a result, the filter, or flip-flops used as delay elements constituting the filter, can be operated with a clock signal DCLK having the same frequency as the frequency of the clock ACLK supplied to the AD converters 11 and 12. Furthermore, because the timings of digital signal sequences output from the AD converters 11 and 12 are synchronized by using the FIFOs 21 and 22, it is possible to operate the first and second portions of the correction filter 32 and 33 with a single-phase clock DCLK. Therefore, a timing design becomes easy.

As explained above, the first and second portions of the correction filter 32 and 33 have characteristics, or impulse responses, shown in FIG. 4. When the timing error $\Delta t=0$, the impulse response shown in FIG. 4 has an appreciable gain only at the index of n=3. Accordingly, the second portion of the correction filter 33 delays the output of FIFO 22 for a period corresponding to the index n=3. The output of FIFO 21 is also delayed by the delay element 31 for the same period. Note that, the characteristic shown in FIG. 4 is an example for the case that number of taps of the filter $N_T=7$. Index n having an appreciable gain changes when the number of taps of the filter changes.

When the timing error $\Delta t \neq 0$, impulse response of the portions of correction filter 32 and 33 also have appreciable gains at indexes other than n=3. For example, when $\Delta t = 0.5\ T_S'$ ($=0.25\ T_S$), the correction filter has the characteristic shown by the dashed line in FIG. 4. As a result, the first portion of the correction filter 32 generates an output. The output of the first portion of the correction filter 32 is added with an output of the FIFO 21, which is delayed by the delay element 31, and is input into the multiplexer 40 as a first corrected digital signal sequence. Further, an output of the FIFO 22 passes through the second portion of the correction filter 33 and is input to the multiplexer 40 as the second corrected digital signal sequence.

Figure 7:
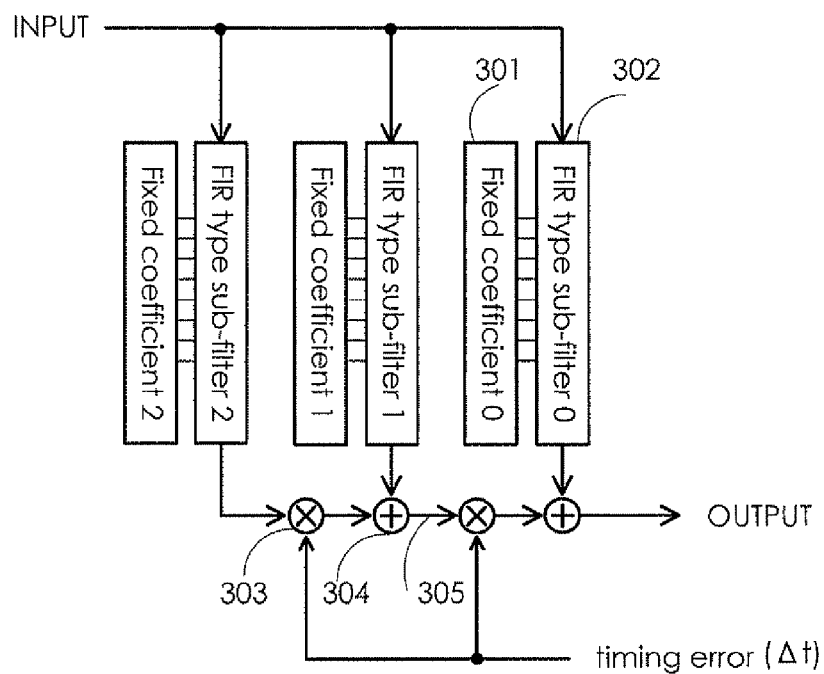
FIG. 7 is a block diagram which shows exemplary construction of each portion of the correction filter shown in FIG. 6.

The portions of the correction filter 32 and 33 may be Farrow type filters having the construction shown in FIG. 7. The Farrow type filter includes a plurality of FIR type sub-filters 302 each utilizes fixed coefficients supplied from fixed-coefficient generator 301. The Farrow type filter has a constitution of:
(1) the plurality of sub-filters 302 are connected in parallel to an input terminal of the Farrow type filter;
(2) an output of the first one of the sub-filters is multiplied with a normalized value of the timing error $\Delta t$ using a multiplier 303, and an output of the multiplier 303 is added with an output of the second one of the sub-filters using an adder 304 to generate an output of the second stage 305; and
(3) outputs of the preceding stages are successively multiplied by the normalized value of the timing error and added with outputs of next ones of the sub-filters 302 to generate outputs of the succeeding stages until an output of the final stage is generated as an output of the Farrow type filter.

As a result, it is possible to change the filter characteristic according to the timing error $\Delta t$ without changing the coefficient of each sub-filter. Accordingly, the problem of increase of circuit size of the filter in accordance with an increase of number of variations of the timing error $\Delta t$ may be solved. In addition, it is not necessary to provide a complex arithmetic circuit to generate the coefficients.

Figure 8:
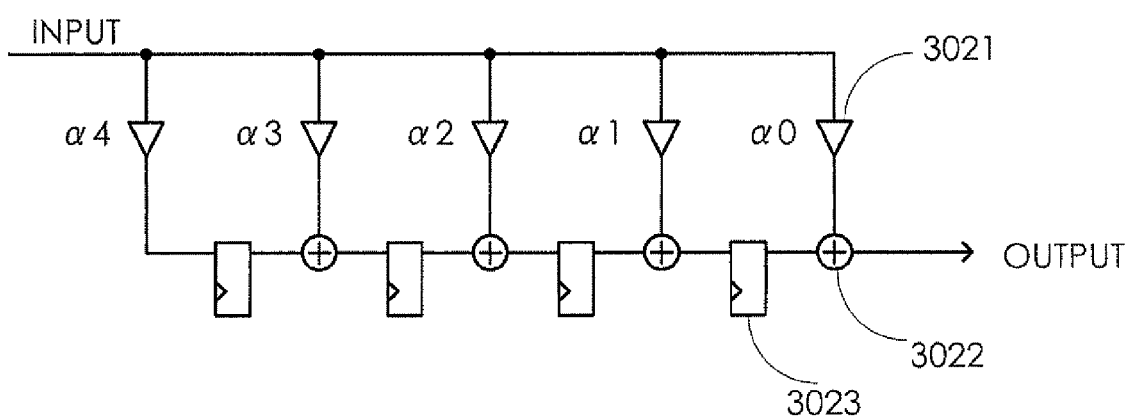
FIG. 8 is a block diagram showing composition of exemplary sub-filter shown in FIG. 7.

FIG. 8 shows a construction of an exemplary sub-filter 302. Numerals 3021 represents a multiplier, 3022 represents an adder, and 3023 represent delay elements, or flip-flops. The exemplary sub-filter 302 shown in FIG. 8 has flip-flops, as delay elements, that operate in synchronous with rising edges of clock signal. It is possible to construct sub-filters constituting the first and second portions of the correction filter 32 and 33, and delay element 31 with flip-flops that operate in synchronous with the same edges of the clock signal. Thereby, the correction filter 30 operates in synchronous with the same edges of the clock DCLK.

The synchronization of digital signal sequences using FIFOs, and the polyphase correction filter may be employed even when more than two (i.e., four, eight, and more) AD converters are interleaved. Thereby, the timing design can be made easy.

Various exemplary AD conversion circuits according to this disclosure may include a timing error measurement circuit 60 integrated on the same chip that the components shown in FIG. 6 are integrated. Impulse responses of the first and second portions of the correction filter 32 and 33 change in accordance with the timing error $\Delta t$ measured by the timing error measurement circuit. In a simplest case, the error can be measured as follows:
(1) a standard analog signal (for example, a sine wave signal with known frequency and amplitude) is commonly input to the AD converters 11 and 12; and
(2) first and second corrected digital signals output from the correction filter 30 are compared with expected signals, and the timing error, or a residual error that cannot be corrected by the correction filter with the current parameters, may be measured. Alternatively, the first and second corrected digital signals are combined, and the residual timing error may be measured by a spectrum analysis of the combined signal.

The error measurement circuit 60 outputs one of Ner values of the timing error $\Delta t$, or error patterns, normalized with a predetermined unit time. The value of timing error $\Delta t$ that the timing error measurement circuit outputs is used as a multiplication coefficient in the multipliers 303 of the Farrow type filter so that a required correction is carried out.

On the other hand, in each of the sub-filters 302 shown in FIG. 8, coefficients of the taps, or gains $\alpha 0$-$\alpha 4$ of the multipliers 3021 are fixed. Nonetheless, the fixed coefficients of the taps in each of the sub-filters 302 are set appropriately so that it is possible to realize response characteristics corresponding to the Ner error patterns by only changing the value of timing error $\Delta t$, or the coefficient of the multipliers 303 of the Farrow type filter.

The calculation method of fixed coefficients of sub-filters 302 of the Farrow type filter is explained as follows. The impulse response of the Farrow type filter shown in FIG. 7 is given by expression (2). Here, $\alpha_k$ represents fixed coefficients of k-th sub-filter, and $N_{SUB}$ represents total number of the sub-filters.

$$h_F[n] = \sum_{k=0}^{N_{SUB}-1} \Delta t^k \alpha_k[n] \quad (2)$$

Because impulse response of an ideal correction filter to correct each of the timing errors is expressed by expression (1), it is possible to substitute the left side of expression (2) with the right side of expression (1). Thereby, equation (3), which indicates that a product of a matrix of timing errors e (=Δt) and a matrix of fixed coefficients α is equal to a matrix of ideal impulse responses h, is provided. It is possible to calculate the matrix of fixed coefficient α by multiplying an inverse matrix of timing errors e from the left of both sides of this equation.

$$\vec{h} = \vec{e} \times \vec{\alpha}$$

When the total number of values of timing error e is $N_{er}$, the matrix of impulse responses h has a size of Ner rows×$N_T$ columns, the matrix of timing errors e has a size of Ner rows×$N_{SUB}$ columns, and the matrix of fixed coefficients α has a size of $N_{SUB}$ rows×$N_T$ columns. Each element of the matrixes is shown in expressions (4), (5), and (6). In a hardware implementation, it is possible to use normalized values of timing errors in order to avoid an influence of rounding errors in multiplications. Specifically, the values of timing errors may be normalized with the minimum unit value of the coefficient of digital multipliers 303 used in the Farrow type filter shown in FIG. 7.

Here, ranges of suffixes i, j, and l are i=1~$N_{er}$, j=1~$N_T$, l=1~$N_{SUB}$' respectively. In other words, $\Delta t_i$ is i-th normalized value of the error, and $\alpha_j[l-1]$ represents the fixed coefficient of j-th tap in l-th sub-filter (sub-filter SUB(l−1) in FIG. 7).

$$h_{i,j} = \mathrm{sinc}\left\{\frac{\pi}{2}\left(j - 1 - \frac{N_T - 1}{2} - \frac{\Delta t_i}{T_s'}\right)\right\}\cos\left\{\frac{\pi}{2}\left(j - 1 - \frac{N_T - 1}{2} + \frac{\Delta t_i}{T_s'}\right)\right\} \quad (4)$$

$$e_{i,l} = \Delta t_i^{l-1} \quad (5)$$

$$\alpha_{i,j} = \alpha_j[l-1] \quad (6)$$

Figure 9:
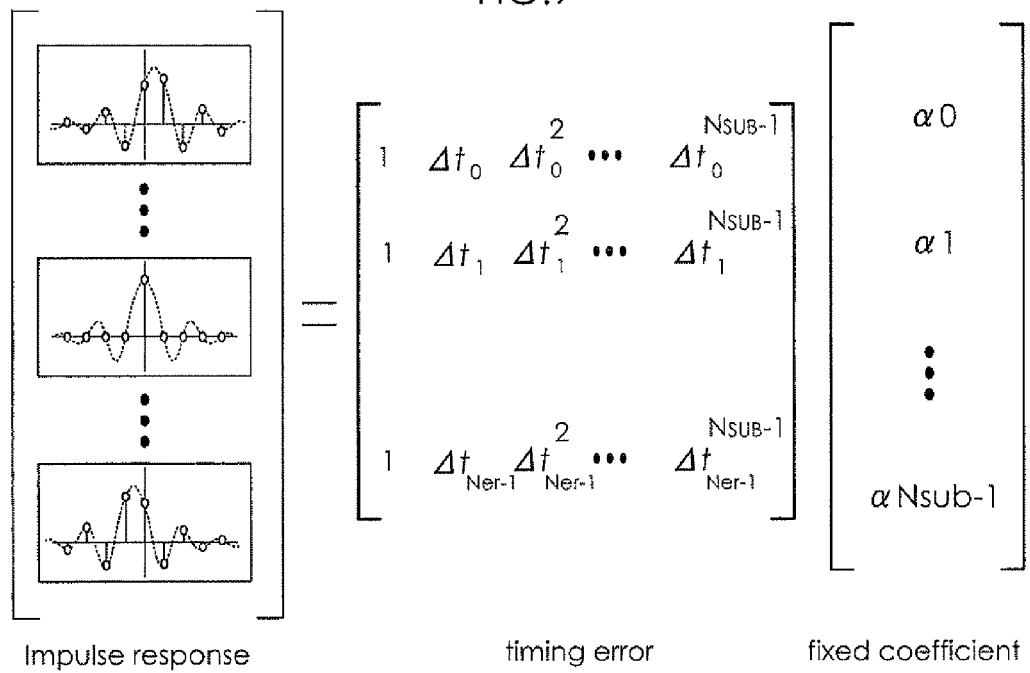
FIG. 9 is schematic representation of expression (3)

The equation (3) is a matrix equation shown in FIG. 9. The left side expresses impulse responses of $N_T$-tap FIR filters suitable to correct i=1st to Ner-th values of timing error Δt. The right side expresses impulse responses of a Farrow type filter having $N_{SUB}$ $N_T$-tap FIR type sub-filters determined by values of timing error Δt supplied as coefficients of multipliers 303 and by the fixed coefficients of the sub-filters. Matrix calculations of equation (3) may calculate $N_T$ fixed coefficients of each of sub-filters 302 constituting the Farrow type filter shown in FIG. 7, which is an FIR type sub-filter including $N_T$ multipliers 3021 and $N_T-1$ delay elements with a delay period of $T_S/2$ shown in FIG. 8, for generating an impulse response suitable to correct each of the values of timing error Δt by using the Farrow type filter.

Fixed coefficients of sub-filters 302 constituting each of the first and second portions of the correction filters are actually determined by separating the fixed coefficients α obtained by the calculation explained above into even-numbered ones (for the first portion 32) and odd-numbered ones (for the second portion 33). Separating the fixed coefficients α into even-numbered ones and odd-numbered ones, and doubling the delay time of delay elements 3023 to $T_S$ enable to operate the first and second portions of the correction filter with a clock signal having a period of $T_S$.

The exemplary AD conversion circuit shown in FIG. 6 has a construction that passes the output of AD converter 12 through the correction filter 30, which is designed to correct an error in the operation timing of the AD converter 12 that is measured using the operation timing of the AD converter 11 as a reference. It is also possible to set a reference timing separated from operation timings of the AD converters 11 and 12, and pass outputs of AD converters 11 and 12 through corresponding correction filters that are designed to correct errors in operation timings of the AD converters 11 and 12 relative to the reference timing.

In this case, for example, in addition to the first and second portions 32 and 33 of the correction filter (first correction filter) designed to correct the error in operation timing of the AD converter 12, different first and second portions of a correction filter (second correction filter) designed to correct the error in operation timing of the AD converter 11 may be provided. An output of the AD converter 12 passed through the first portion 32 of the first correction filter may be added with an output of the AD converter 11 passed through the second portion of the second correction filter to generate a first corrected signal. Further, an output of the AD converter 12 passed through the second portion 33 of the first correction filter may be added with an output of the AD converter 11 passed through the first portion of the second correction filter to generate the second corrected signal.

Second Embodiment

Figure 10:
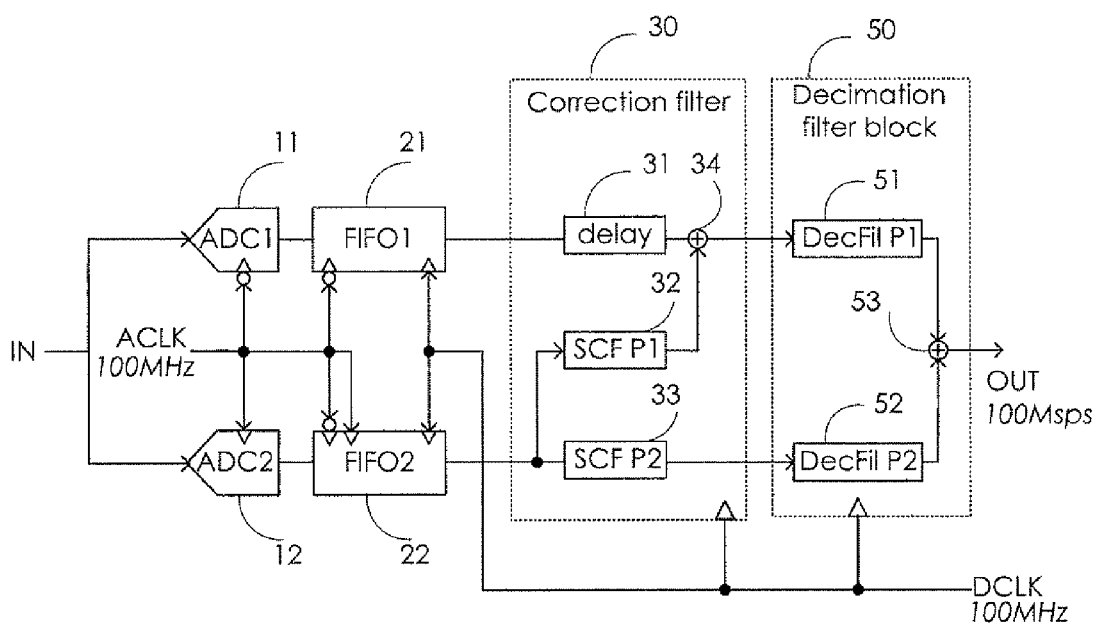
FIG. 10 is a block diagram showing construction of second exemplary AD conversion circuit according to this disclosure.

FIG. 10 shows a second exemplary AD conversion circuit according this disclosure. In the first exemplary AD conversion circuit, errors due to the error in operation timings of the first and second AD converters 11 and 12 are corrected by the portions 32 and 33 of the correction filter to generate first and second corrected digital signal sequences. And a multiplexer 40 re-arranges the first and second corrected digital signal sequences by shifting them by a half of a cycle period of the clock ACLK of the AD converter 11 and 12, which corresponds to one scale of the horizontal axis of FIG. 4, and output the re-arranged sequences.

In the second exemplary embodiment, on the other hand, the first and second corrected signals output from the correction filter 30 are received by a decimation filter block 50. The decimation filter block 50 is a low-pass filter that has an impulse response expressed by expression (7) and shown in FIG. 11.

$$h[n] = \begin{cases} 1 & (n = 0) \\ \mathrm{sinc}\left(\frac{\pi}{2}n\right) & (n = \text{odd number}) \\ 0 & (n = \text{the case except the above}) \end{cases} \quad (7)$$

The decimation filter block 50 operates with the clock DCLK that is commonly supplied to the correction filter 30. The decimation filter block 50 includes a first and a second decimation filters 51 and 52 and an adder 53. Here, the decimation filter also has a polyphase structure. That is, outputs of AD converters 11 and 12, which are corrected by polyphase correction filter 30 having portions 32 and 33, are processed by polyphase decimation filter 50 having first and second decimation filters 51 and 52, respectively.

Figure 11:
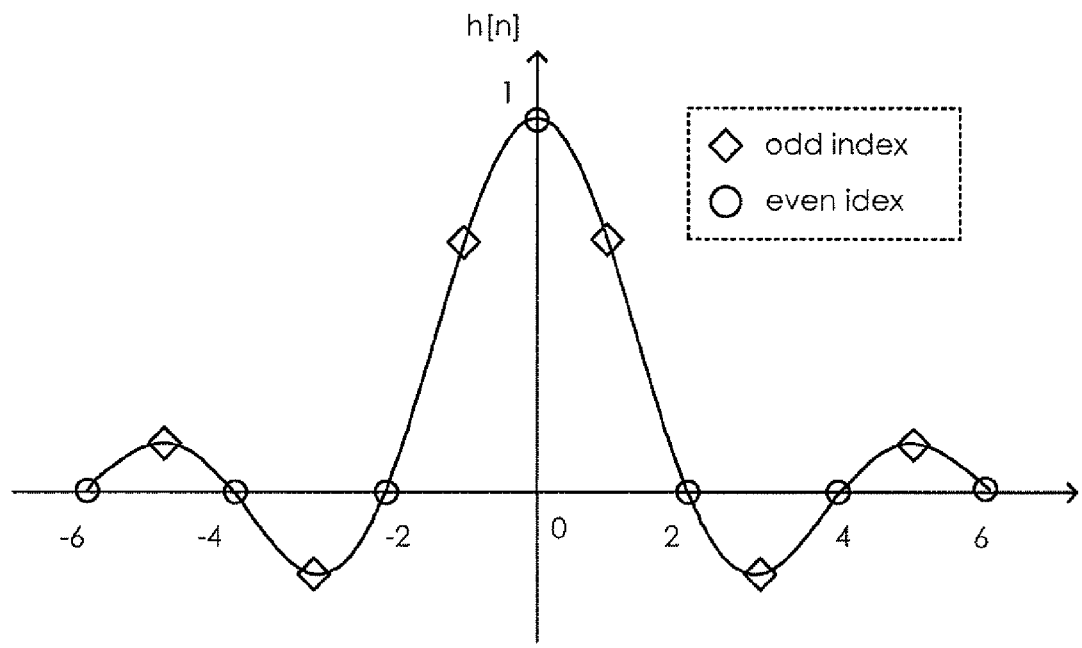
FIG. 11 illustrates exemplary impulse response of decimation filter shown in FIG. 10.
Figure 12:
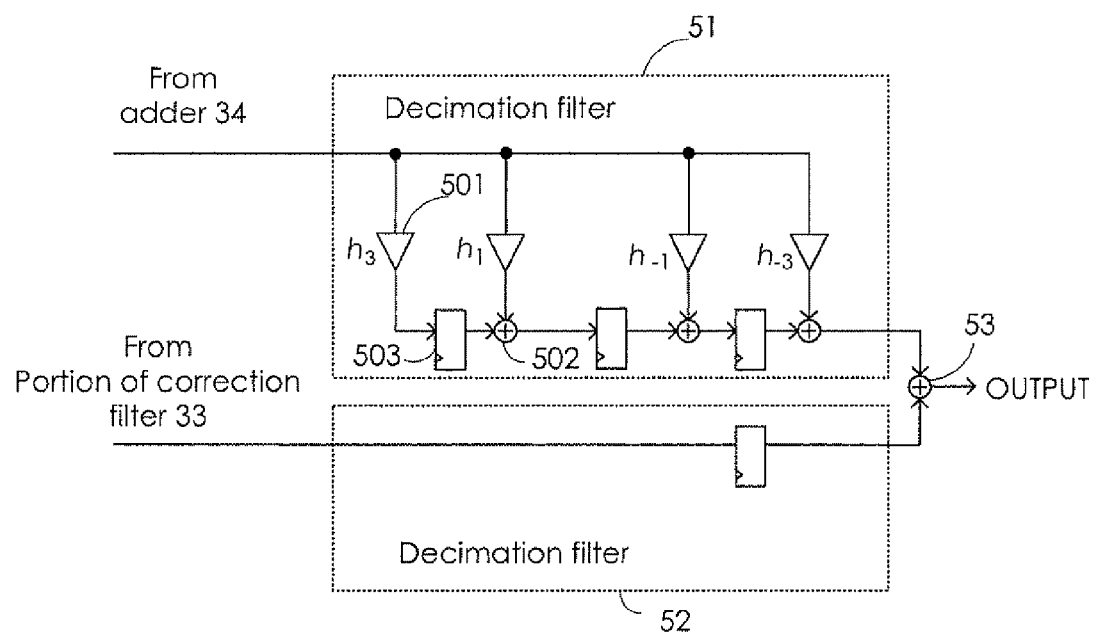
FIG. 12 is a block diagram showing exemplary construction of decimation filter shown in FIG. 10.

Specifically, a 7-tap down-sampling ½ decimation filter having an impulse response shown in FIG. 11 is separated into the first decimation filter 51 having the impulse response of odd-numbered indexes and the second decimation filter 52 having the impulse response of even-numbered indexes, as shown in FIG. 12. Numerical 501 represents a multiplier, numerical 502 represents an adder, and numerical 503 represents a delay element, or a flip-flop. Because the impulse response shown in FIG. 11 has non-zero gains at odd-numbered indexes and at the index of 0, the first decimation filter 51 has a construction of a FIR type filter and the second decimation filter has a construction of a delay circuit.

Because the decimation filter 50 also has a polyphase structure, it is possible to operate the decimation filters 51 and 52 with clock DCLK having the same frequency of the sampling clock ACLK supplied to the AD converters 11 and 12. Furthermore, because the timings of the AD converters 11 and 12 are synchronized by the FIFOs 21 and 22, the decimation filters 51 and 52 can be operated with a single phase clock DCLK.

That is, both portions of the correction filter 32 and 33 and the decimation filters 51 and 52 can be operated with a single phase clock DCLK having the same frequency of the sampling clock ACLK of the AD converters 11 and 12. As a result, timing design is easy. Specifically, the polyphase decimation filters 51 and 52 shown in FIG. 12 employs flip-flops that operate in synchronous with rising edges of the clock signal as delay elements. Therefore, similar to the correction filter 30 constructed with the sub-filters 302 shown in FIG. 8, the decimation filter block 50 can operate in synchronous with the same edges of the clock DCLK.

The synchronization of output signals of AD converters by using FIFOs and the polyphase correction filter may also be employed when interleaving more than 2 (for example, 4, 8 and more) AD converters. Thereby, a timing design becomes easy.

In the first and second exemplary embodiments described above adopted a correction filter proposed in non-patent document 1, which has impulse responses shown in FIG. 4. Thereby, a bandwidth of analog signal that can be processed by a time-interleaved AD conversion circuit is widened. When, for example, a required bandwidth is narrow, however, it is possible to adopt, similar to the first and second conventional arts, a correction filter having impulse responses shown in FIG. 1. The synchronization of output signals of AD converters by using FIFOs, the polyphase correction filter and, optionally, the polyphase decimation filter may also be employed even in the case that the correction filter having impulse responses shown in FIG. 1 is adopted. Thereby, it is possible to operate the correction filter and, optionally, the decimation filter with a single-phase clock having the same frequency as the sampling clock of the AD converter. And a timing design becomes easy.

Furthermore, the correction filter may be constructed with Farrow type fillers each including a plurality of sub-filters having fixed parameters. Thereby, corrections according to an amount of timing errors can be made without requiring a large memory to store parameters of the filter or a complex parameter generation circuit.

Finally, a correspondent of following expression (8), which is shown in non-patent documents 1 as expression (2), and expression (1) of this disclosure, is explained.

$$h[n] = -\frac{\sin\left(\pi \frac{\Delta t}{T_S}\right)}{\pi\left(n - \frac{\Delta t}{T_S}\right)} \tag{8}$$

$T_S$ in expression (8) corresponds to $T_S'$ in this disclosure. Moreover, in expression (8), index n=0 is assigned to the center tap. When non-negative index is assigned to each of the taps within the limited range included in the filter, expression (8) become the following expression (9).

$$h[n] = -\frac{\sin\left(\pi \frac{\Delta t}{T_S}\right)}{\pi\left(n - \frac{N_T - 1}{2} - \frac{\Delta t}{T_S}\right)} \tag{9}$$

Oppositely, the expression (1) of this disclosure assigns non-negative integer index to each of the taps. When index n=0 is assigned to the center tap, the expression (1) becomes following expression (10).

$$h[n] = \mathrm{sinc}\left\{\frac{\pi}{2}\left(n - \frac{\Delta t}{T_s}\right)\right\}\cos\left\{\frac{\pi}{2}\left(n + \frac{\Delta t}{T_s}\right)\right\} \tag{10}$$

The expression (10) can be developed to reach the expression (11), which is the same as expression (8), as follows.

$$\begin{aligned}h[n] &= \sin c\left\{\frac{\pi}{2}\left(n - \frac{\Delta t}{T_s}\right)\right\}\cos\left\{\frac{\pi}{2}\left(n + \frac{\Delta t}{T_s}\right)\right\} \\ &= \frac{2}{\pi\left(n - \frac{\Delta t}{T_s}\right)}\sin\left\{\frac{\pi}{2}\left(n - \frac{\Delta t}{T_s}\right)\right\}\cos\left\{\frac{\pi}{2}\left(n + \frac{\Delta t}{T_s}\right)\right\} \\ &= \frac{2}{\pi\left(n - \frac{\Delta t}{T_s}\right)}\frac{1}{2}\left[\sin\left\{\frac{\pi}{2}\left(n - \frac{\Delta t}{T_s} + n + \frac{\Delta t}{T_s}\right)\right\} + \right.\\ &\qquad \left.\sin\left\{\frac{\pi}{2}\left(n - \frac{\Delta t}{T_s} - n - \frac{\Delta t}{T_s}\right)\right\}\right] \\ &= \frac{2}{\pi\left(n - \frac{\Delta t}{T_s}\right)}\frac{1}{2}\left\{\sin(n\pi) - \sin\left(\pi\frac{\Delta t}{T_s}\right)\right\} \\ &= -\frac{\sin\left(\pi\frac{\Delta t}{T_s}\right)}{\pi\left(n - \frac{\Delta t}{T_s}\right)}\end{aligned} \tag{11}$$

What is claimed is:

1. Time-interleaved analog-to-digital (AD) conversion circuit, comprising:
   a first and a second AD converter that generate a first and a second digital signal sequence by converting an analog input signal into first and second digital signals with a first frequency at first and second timings mutually different with each other;
   a FIFO that receives the first and second digital signal sequences and outputs the first and second digital signal sequences at same timings as a first and a second synchronized digital signal sequence; and
   a correction filter that corrects errors in the second digital signal sequence caused by an error in the second timings from reference timings, the correction filter including a first and a second portion that are supplied with a common clock signal having the first frequency and operate in synchronous with the common clock signal, each of the first and second portions of the correction filters including a plurality of delay elements each having a delay time equal to a cycle period of the common clock signal;
   wherein the correction filter generates:
   a first corrected digital signal sequence by passing the second synchronized digital signal sequence through the first portion of the correction filter and adding the first synchronized digital signal sequence and the second synchronized digital signal sequence passed through the first portion of the correction filter; and a second corrected digital signal sequence by passing the second synchronized digital signal sequence through the second portion of the correction filter.

2. The time-interleaved AD conversion circuit of claim 1, further comprising:

a decimation filter including a first portion and a second portion that are supplied with the common clock signal and operate in synchronous with the common clock signal, each of the first and second portions of the decimation filter including a second delay element having a second delay time equal to the cycle period of the common clock signal, wherein the decimation filter generates an output digital signal sequence by:

passing the first corrected digital signal sequence through the first portion of the decimation filter and the second corrected digital signal sequence through the second portion of the decimation filter; and adding the first correct digital signal sequence passed through the first portion of the decimation filter and the second corrected digital signal sequence passed through the second portion of the decimation filter.

3. The time-interleaved AD conversion circuit of claim 1, wherein:

the correction filter further includes a delay element that delays the first synchronized digital signal sequence, wherein the correction filter generates the first corrected digital signal sequence by adding the first synchronized digital sequence delayed by the delay element and the second synchronized digital signal sequence passed through the first portion of the correction filter.

4. The time-interleaved AD conversion circuit of claim 2, wherein:

one of the first and second portions of decimation filter is a FIR type filter, and the other one of the first and the second portions of the decimation filter is a delay circuit.

5. The time-interleaved AD conversion circuit of claim 1, wherein:

each of the first and second portions of the correction filter is a Farrow type filter comprising:

$N_{SUB}$ ($N_{SUB} \geq 2$) finite impulse response (FIR) type sub-filters with fixed coefficients each receiving the second synchronized digital signal sequence and including a corresponding plurality of the delay elements;

a first multiplier that multiplies an output of a first one of the sub-filters by a normalization value of the error in the second timings;

second to ($N_{SUB}-1$)th multipliers each multiplying a sum of an output of corresponding one of the sub-filters and an output of a preceding one of the multipliers by the normalized value of the error; and an output terminal that outputs a sum of an output of the ($N_{SUB}-1$)th multiplier and an output of an $N_{SUB}$-th one of the sub-filter as an output of the Farrow type filter.

6. The time-interleaving analog-to-digital conversion circuit of claim 5, further comprising:

an error measurement circuit that measures the error in the second timings and generates the normalized value of the error.

7. The time-interleaving analog-to-digital conversion circuit of claim 5, wherein, the fixed coefficients of the FIR type sub-filters of the first and second portions of the correction filter are determined by:

(1) under an assumption that, for each of a first to an Ner-th (Ner≧2) one of the normalized value of the error in the second timings:

(a) an impulse response of each of Ner $N_T$-tap ($N_T \geq 2$) FIR type filters that is suitable to correct the normalized value of the error; and (b) an impulse response of an imaginary Farrow type filter comprising:

$N_{SUB}$ $N_T$-tap FIR type sub-filters;

a first multiplier that multiplies an output of a first one of the sub-filters by the normalized value of the error;

a second to a ($N_{SUB}-1$)th multipliers each multiplying a sum of an output of preceding one of the multipliers and an output of corresponding one of the sub-filters by the normalized value of the error; and an output terminal that outputs a sum of an output of the ($N_{SUB}-1$)th multiplier and an output of an $N_{SUB}$-th one of the sub-filters as an output of the Farrow type filter;

are identical with each other, calculating coefficients of each of the sub-filters of the imaginary Farrow type filter; and (2) separating even-numbered ones and odd-numbered ones of the calculated coefficients of each of the sub-filters of the imaginary Farrow type filter as the fixed coefficients of each of the sub-filters of the first and second portion of the correction filters, respectively.

8. A method of analog-to-digital (AD) conversion, comprising:

generating a first and a second digital signal sequence by converting an analog input signal into first and second digital signals with a first frequency at first and second timings mutually different with each other;

receiving the first and second digital signal sequences and outputs the first and second digital signal sequences at same timings as a first and a second synchronized digital signal sequence; and correcting errors in the second digital signal sequence caused by an error in the second timings from reference timings, the correcting including supplying a common clock signal having the first frequency to a first and a second portion of a correction filter and operating the first and second portions of the correction filter in synchronous with the common clock signal, each of the first and second portions of the correction filters including a plurality of delay elements each having a delay time equal to a cycle period of the common clock signal;

wherein the correcting includes:

generating a first corrected digital signal sequence by passing the second synchronized digital signal sequence through the first portion of the correction filter and adding the first synchronized digital signal sequence and the second synchronized digital signal sequence passed through the first portion of the correction filter; and generating a second corrected digital signal sequence by passing the second synchronized digital signal sequence through the second portion of the correction filter.

9. The method of claim 8, further including:

determining fixed coefficients of FIR type sub-filters of the first and second portions of the correction filter by:

(1) under an assumption that, for each of a first to an Ner-th (Ner≧2) one of the normalized value of the error in the second timings:

(a) an impulse response of each of Ner $N_T$-tap ($N_T \geq 2$) FIR type filters that is suitable to correct the normalized value of the error; and (b) an impulse response of an imaginary Farrow type filter comprising:

$N_{SUB}$ $N_T$-tap FIR type sub-filters;
a first multiplier that multiplies an output of a first one of the sub-filters by the normalized value of the error;
a second to a ($N_{SUB}$−1)th multipliers each multiplying a sum of an output of preceding one of the multipliers and an output of corresponding one of the sub-filters by the normalized value of the error; and
an output terminal that outputs a sum of an output of the ($N_{SUB}$−1)th multiplier and an output of an $N_{SUB}$-th one of the sub-filters as an output of the Farrow type filter;
are identical with each other, calculating coefficients of each of the sub-filters of the imaginary Farrow type filter; and (2) separating even-numbered ones and odd-numbered ones of the calculated coefficients of each of the sub-filters of the imaginary Farrow type filter as the fixed coefficients of each of the sub-filters of the first and second portions of the correction filters, respectively.

10. The time-interleaved AD conversion circuit of claim 1, wherein:
the correction filter has an impulse responses determined by the formula:

$$h[n] = \mathrm{sinc}\left\{\frac{\pi}{2}\left(n - \frac{N_T - 1}{2} - \frac{\Delta t}{T'_s}\right)\right\}\cos\left\{\frac{\pi}{2}\left(n - \frac{N_T - 1}{2} + \frac{\Delta t}{T'_s}\right)\right\}$$

wherein $T_S'$ is a half of a sampling period of each of the first and second AD converters, $N_T$ represents a number of taps of the correction filter, and n represents indexes of the impulses responses.

* * * * *